Feb. 26, 1952

W. D. LOUGHLIN ET AL 2,587,493

MODULATED SIGNAL GENERATOR

Filed Aug. 6, 1947

Inventors:
William D. Loughlin,
Donald M. Hill,

By Pierce, Scheffler & Parker,
Attorneys.

Patented Feb. 26, 1952

2,587,493

UNITED STATES PATENT OFFICE 2,587,493

MODULATED SIGNAL GENERATOR

William D. Loughlin, Mountain Lakes, and Donald M. Hill, Boonton, N. J., assignors to Boonton Radio Corporation, Boonton, N. J., a corporation of New Jersey Application August 6, 1947, Serial No. 766,538

9 Claims. (Cl. 250—36)

This invention relates to modulated signal generators, and more particularly to signal generators operating in a plurality of ranges in the very high frequency region for developing radio frequency signal voltages which may be frequency-modulated, amplitude modulated or both frequency and amplitude modulated.

An essential requirement for a frequency-modulated signal generator is a constant modulator sensitivity over the frequency range or ranges, but the usual reactance tube modulating circuits produce deviations of the oscillator frequency which vary with the tuning of the oscillator. A controlled deviation which is independent of the signal generator frequency has been obtained by a heterodyne system including an oscillator of fixed frequency and an oscillator of adjustable frequency, the "fixed frequency" oscillator being frequency-modulated to a desired extent by variation of the modulating potential applied to a reactance tube. When the desired deviation has been chosen, it is necessarily maintained constant regardless of the output frequency since the frequency deviations of the fixed frequency oscillator are transferred unaltered to both the sum and the difference frequencies which are developed in the mixer stage. Such a heterodyne system was employed for the prior frequency-modulation band of 42–50 megacycles but it is not well suited for a signal generator operating in the very high frequency region to cover the services utilizing frequency modulation in the frequency range of 54 to 216 megacycles. Harmonics of the two oscillator frequencies, and the sum and difference frequencies of the various harmonics introduce spurious frequency outputs which are not harmonically related to the desired output and may, in fact, coincide with it. These spurious frequencies may be substantially excluded from the output signal only by employing the difference frequency of the heterodyne system, but this necessitates operation of the oscillators at frequencies so high that frequency stability is a major problem. Furthermore, the frequency converter is inefficient, as compared with an amplifier or multipler stage, and must be followed by one or more tuned amplifier stages, and this gives rise to the difficult problem of tracking the tunable oscillator and a cascaded amplifier operating at the difference frequency.

Objects of the present invention are to provide constant-deviation frequency modulated signal generators which are stable in operation over a wide band of frequencies extending into the very high frequency region, which are substantially free from spurious frequency signals, and which are more efficient than the heterodyne systems so far as concerns the number of tubes required to obtain a given output level.

An object is to provide a frequency-modulated signal generator in which a constant-deviation modulation is imposed upon an oscillator tunable over a frequency range, and the oscillator is followed by a stage which may be adjusted manually to operate as an amplifier or as a multiplier of the radio frequency signal. An object is to provide a signal generator which may be frequency-modulated with a constant deviation over a frequency range, amplitude modulated, or both frequency and amplitude modulated. A further object is to provide a frequency modulated signal generator which is tunable over a relatively high frequency range and an auxiliary unit which converts the modulated output of the signal generator to a lower frequency signal of substantially the same magnitude. A further object is to provide a frequency-modulation signal generator including an oscillator modulated by a reactance tube, the oscillator including elements which are independently adjustable to control the sensitivity of the reactance tube and the linearity of the modulated output.

These and other objects and advantages of the invention will be apparent from the following specification when taken with the accompanying drawings in which.

Figure 1:
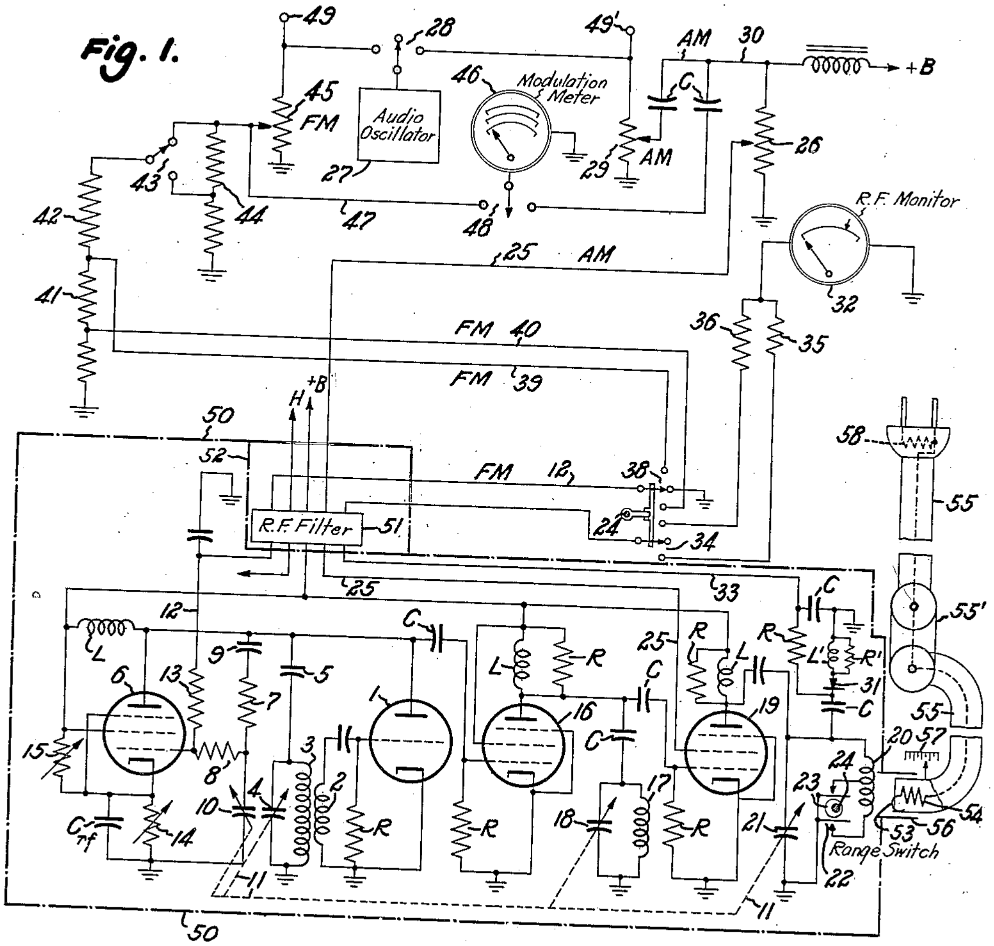
Fig. 1 is a schematic circuit diagram of a signal generator embodying the invention.

In Fig. 1 of the drawings, the reference numeral 1 identifies an oscillator tube having a grid circuit inductance 2 coupled to a plate circuit inductance 3; the inductance 3 being shunted by a variable condenser 4 to constitute the tunable tank circuit of the oscillator. The tank circuit is connected through a blocking condenser 5 to the plate of the oscillator tube 1 and to the plate of a reactance tube 6. The phase-shifting network of tube 6 comprises a pair of resistors 7, 8 connected in series between the plate and grid through a blocking condenser 9, and a variable condenser 10 connected between the junction of the resistors and ground. The variable condenser 10 is preferably ganged to the tuning condenser 4 of the tank circuit, as indicated by the broken lines 11, to extend the tuning range over which a substantially constant frequency deviation is obtained.

An audio frequency voltage of adjustable magnitude is impressed upon the grid of the reactance tube 6 through a lead 12 which includes a decoupling resistor 13, the lead 12 being also identified on the drawing by the letters "FM" to indicate that it is the lead carrying voltage for frequency modulation. The reactance tube provides a frequency deviation which is substantially constant over an oscillator tuning range of two-to-one for a given amplitude of the impressed modulating voltage. Reactance tubes which develop substantially constant frequency or phase deviation for a modulating voltage of a given amplitude are described and claimed in the copending application of Murray G. Crosby, Ser. No. 708,408, filed Nov. 7, 1946, now U. S. Patent No. 2,521,694 dated September 12, 1950 and a detailed explanation of the method of operation of the described phase-shifting network is presented in that application.

The energizing circuits of the reactance tube 6 include independently adjustable elements for controlling the linearity of the deviation for changes in the amplitude of the applied modulating voltage and for determining the deviation sensitivity. In this discussion "deviation sensitivity" is used to denote the frequency deviation per volt of applied modulating voltage and the term "deviation" denotes the maximum excursion of the deviated frequency from the center or unmodulated frequency. The cathode resistor 14 of tube 6 is bypassed by condenser $C_{rf}$ for radio frequencies only, so that degeneration is produced for modulation frequencies thus providing a means for controlling the deviation sensitivity of tube 6. Other adjustable means are provided to impose the proper cathode bias on tube 6 to produce a minimum of modulation distortion. The bias may be developed by a battery or other voltage source, or by a voltage source in combination with an adjustable current through the cathode resistance 14. As illustrated, the bias is developed by a "bleeder" resistance 15 of adjustable value which is connected between the screen grid and the cathode end of the cathode resistor 14. The modulated oscillator is conditioned for use by adjusting the cathode resistor 14 for the desired deviation sensitivity. The bleeder resistor 15 is adjusted for minimum distortion, and the setting of the resistor 14 is then rechecked and, if necessary, readjusted to provide the desired deviation sensitivity.

The oscillator tube 1 works into a frequency doubler stage comprising a tube 16 having a tuned output circuit comprising an inductance 17 shunted by a variable condenser 18 which is ganged to oscillator tuning condenser 4. This frequency doubler stage is followed by an output stage in which a tube 19 has a tuned plate circuit comprising a tapped inductance 20 and a tuning condenser 21 which is ganged to the other tuning condensers. The output stage operates as an amplifier when the tuning condenser is connected across the entire inductance 20 by a range-changing switch 22, and it operates as a frequency multiplier when the switch is adjusted to connect the condenser across a part only of the inductance. The range-changing switch 22 preferably has a central open-circuit position and, as illustrated, it comprises two spring blades normally spaced from contacts connected to the tap and to the end respectively of the inductance 20, and a cam operator 23 on a shaft 24 which extends between the switch blades. As shown schematically in Fig. 1, a clockwise adjustment of shaft 24 will close the switch 22 on the inductance tap to condition the output stage for operation as a frequency multiplier, and a counterclockwise adjustment will close the switch on the end terminal of the inductance 20 to condition the output stage for operation as an amplifier.

A number of circuit elements which are essential for satisfactory operation of electron tube circuits are illustrated in Fig. 1 and are identified by reference characters L, R and C, according to the character of their impedances, but will not be specifically described and identified as they conform to standard practice in the industry.

The signal voltage developed across the output circuit 20, 21 is monitored, as will be explained later, and is maintained at a preselected level by manual adjustment of the gain of the output stage, through a control of the direct current voltage impressed upon the screen grid of the output tube 19. The screen grid lead 25 extends to the contact arm of a potentiometer 26 which is connected between a direct current source, indicated by the symbol +B, and ground. The direct current source may be batteries but is preferably a conventional rectifier and filter assembly, not shown, energized from an alternating current power distribution system.

The signal voltage developed across the output circuit 20, 21 may be amplitude modulated to a desired degree or percentage by connecting an audio frequency oscillator 27, through a modulation-selecting switch 28, to a potentiometer 29 having an adjustable contact arm connected by lead 30 to the high voltage end of the gain-control potentiometer 26. The letters "AM" are applied to the leads 25, 30 and to the potentiometer 29 in Fig. 1 to indicate the path of the amplitude modulating voltage. The doubler stage acts as a buffer between the amplitude modulation circuit and the oscillator 1, hence amplitude modulation produces little or no spurious frequency modulation of the output signal.

The radio frequency monitor circuit includes a crystal rectifier 31 connected between the high voltage side of the output circuit 20, 21 and ground. The circuit connections include a lead 33 from the rectifier 31 to the contact arm of a switch 34 having contacts connected to the meter 32 through individual calibrating resistors 35, 36 for the low and the high frequency ranges respectively. The contact arm of the monitor circuit switch 34 is actuated by the shaft 24 of the range-changing switch 22. An inductor L′ shunted by a damping resistor R′ is connected in series with the crystal rectifier 31, to compensate the decay of rectification efficiency with increasing frequency which is characteristic of this type of rectifier.

The switch shaft 24 also operates a switch 38 in the frequency modulation network to adjust the amplitude of the modulating voltage applied to reactance tube 6 as an inverse function of the multiplier ratio of the output stage. The lead 12 from the control grid of the reactance tube 6 is connected to the contact arm of switch 38, and the end contacts of switch 38 are connected by leads 39, 40 to the high voltage end and to the center tap junction, respectively, of a resistor 41.

When range switch 22 and the associated switch 38 are switched, both the output frequency and the modulation voltage level are changed by a factor of two to one. In this manner the deviation previously established is unaffected by changing the frequency range. The high voltage end of resistance 41 is connected to the audio frequency oscillator 27 through a resistor 42 of the same value as resistance 41, a switch 43, a tapped resistor 44, and a potentiometer 45 across which the audio frequency oscillator 27 may be connected by the switch 28. The adjustable tap of the potentiometer 45 is connected to the modulation meter 46 by a lead 47 and switch 48, and the meter 46 therefore indicates the audio frequency potential between the potentiometer tap and ground. A preselected fraction of this measured voltage is impressed across the resistors 41, 42 when the switch 43 is adjusted from its illustrated end position to the tap of resistance 44. The meter 46 is provided with a frequency deviation scale for the respective deviation ranges corresponding to use of the measured voltage and of the selected fraction of that voltage as the control voltage for the reactance tube 6. The scale of the meter 46 is also graduated in values of amplitude modulation, and either frequency deviation or percentage amplitude modulation may be measured by the meter 46 on appropriate adjustment of the switch 48.

Binding posts or terminals 49 and 49′ are connected to the high voltage ends of the modulation-controlling potentiometers 45 and 29 respectively. An external oscillator may be connected between ground and terminal 49 or 49′ to provide frequency or amplitude modulation respectively. Since both internal and external audio oscillators may be simultaneously employed both frequency modulation and amplitude modulation may be imposed upon the radio frequency signal, and each modulation may be individually adjusted to a desired value by its potentiometer control. This type of double modulated signal is particularly useful in testing the amplitude modulation rejection of frequency-modulation receivers. The external oscillator and internal oscillator 27 may also be used to impose two modulations of the same type upon the radio frequency signal. Synchronizing voltages from the oscillator 27 which may be applied to an external circuit, are available between ground and terminal 49 or 49′.

The oscillator and its associated amplifier and doubler stages are located within a shield casing which is indicated schematically by the broken line 50, and the several leads, including a cathode heater lead H, are brought out through a radio frequency filter assembly 51 which may be shielded from the high frequency circuits by a shield partition 52.

A mutual inductance or piston type of attenuator is coupled to the inductance 20 of the output stage to develop an output voltage which is adjustable over a range which may be, for example, from 0.1 microvolt to 0.2 volt. As shown schematically in Fig. 1, the coupling loop 53 and a resistor 54 are mounted at the end of a coaxial cable 55 which is longitudinally slidable in the grounded attenuator tube 56. The displacement of the coupling loop is indicated on a scale 57 which is calibrated in values of output voltage. The output impedance of the signal generator is maintained constant by terminating the output cable 55 with a resistor 58 equal in magnitude to the characteristic impedance of cable 55 and of the same value as resistor 54, for example a 53 ohm resistor. The cable 55 is preferably made in two sections joined by a detachable coupling 55′. One section of this coupling is a jack which is mounted on the front panel. The other section is a plug which, with shielded cable 55, resistor 58 and two terminal posts, comprises an external output unit.

Figure 2:
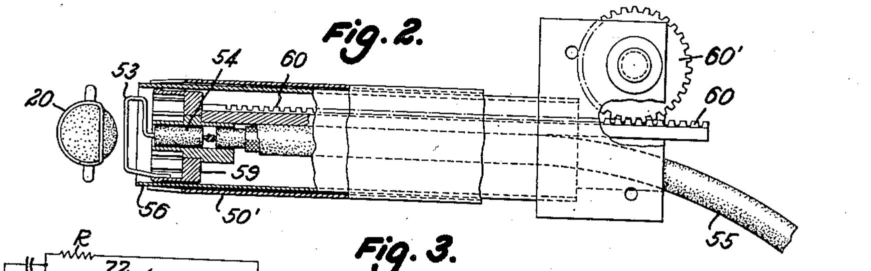
Fig. 2 is a fragmentary sectional view of the output coil and the attenuator of the signal generator.

As illustrated in Fig. 2, the inductance 20 is of D-shape, and the coupling loop 53 is flat and parallel to the flat side of the coil 20. The D-shaped coil presents a more uniform field to the attenuator tube and allows closer coupling, and therefore more output voltage, than could be obtained with the usual coils of circular cross-section. The inner end of the cable 55 and the resistor 54 are supported by a head 59 which has a slotted resilient flange for maintaining good electrical contact with the attenuator tube 56. The sliding head 59 is adjusted by means of a rack 60 and a gear 60′ attached on the shaft which carries the movable element of the attenuator scale 57. The attenuator assembly may be removably mounted in a shield tube 50′ which is a part of the shield casing 50.

The oscillator-amplifier assembly, the associated control and measuring circuits, and a power supply unit, not shown, are preferably housed within a portable casing which is provided in the usual manner with such shielding of individual elements as may be required in addition to the shield casing 50 of the oscillator and amplifier circuits. The signal generator may be designed for operation at different frequency ranges, and one commercial embodiment of the invention covers the range of from 54 to 216 megacycles, in two bands. The oscillator 1 is tunable over the range of from 27 to 54 megacycles, and the radio frequency output from the frequency doubler stage is therefore adjustable from 54 to 108 megacycles. The signal output falls in this frequency range when the output stage operates as an amplifier, and it is doubled in frequency to fall in the range of from 108 to 216 megacycles upon adjustment of the range-change switch 22 for operation of the output stage as a frequency doubler.

Figure 3:
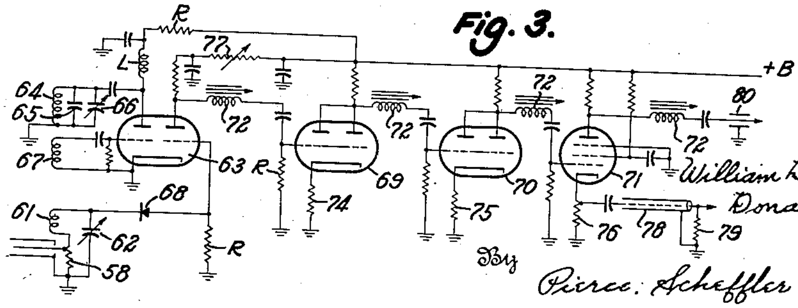
Fig. 3 is a schematic circuit diagram of a converter unit for reducing the frequency of the signal generator output to a lower level without change in amplitude.

Measured modulated voltages in a lower radio frequency range may be developed from the signal generator of Fig. 1 by means of a unity-gain converter as shown in Fig. 3. The signal generator serves as a modulated variable oscillator to inject a measured modulated voltage into the mixer circuit to beat with an unmodulated voltage of relatively fixed frequency which is developed by the local oscillator. The terminal resistor 58 of the output cable 55 of the signal generator is connected in series in the mixer circuit. This circuit comprises an inductance 61 and a condenser 62 which is factory adjusted to tune the mixer circuit. This compensates for a drop in the gain of the converter amplifier at the upper end of its operating range of from 100 kilocycles to 25 megacycles. The local oscillator is one triode section of a double triode tube 63 of the 6J6 type, but a separate tube may be used. The oscillator is tuned to 70 megacycles by a plate circuit inductance 64 and condensers 65 and 66. The small variable condenser 66 permits adjustment of this semi-fixed heterodyne frequency over a narrow frequency range, for example of ±240 kilocycles, and selectivity measurments may be made by means of this calibrated incremental frequency control. The small condenser 66 may also serve as a vernier for the selection of the converter output frequency after adjustment of the tuning condenser 4 of the signal generator oscillator. The grid circuit inductance 67 is returned to the cathode, and the latter is grounded. The grounding of the oscillator cathode results in a substantiallly complete elimination of 60 cycle hum modulation when the power unit for energizing the converter is a conventional rectifier-filter assembly operating from an alternating current light and power system.

The coupling between the two oscillators is exceedingly loose, and this prevents interaction except in a very narrow frequency region close to zero beat. The mixer preferably used is a "fixed" germanium crystal 68, for example a "fixed" germanium crystal, which is connected between the high potential end of the mixing circuit and the grid of the second triode section of the tube 63. The use of the crystal improves the efficiency of the converter since the second triode of the tube 63 then operates as an amplifier and develops an output voltage which is several times larger than that obtained when the crystal is omitted and the second triode is employed as the mixer. The first amplifier stage is followed by two amplifier stages including tubes 69, 70 which may be of the type 6J6 double triode and an output tube 71 of the 6AG7 pentode type. The coupling circuits of the cascaded amplifier stages include adjustable inductances 72 which are "stagger-tuned" to afford a substantially flat over-all gain over the operating range of from 100 kilocycles to 25 megacycles. The cathode resistors 74 to 76 of the several amplifier stages are not bypassed for radio frequency, and the amplifiers are therefore degenerative.

A coaxial output cable 78 terminated in its characteristic impedance by resistor 79 is connected across the cathode resistor 76 of the output tube 71. The output unit of the signal generator may conveniently be used for this purpose and the radio frequency voltage across the terminating resistor may be applied to a receiver or other apparatus which is to be tested. The over-all gain of the cascaded amplifier stages is so adjusted, by a variable resistor 77 in the plate circuit of the first amplifier, that the radio frequency voltage across resistor 79 is equal to the radio frequency voltage impressed across the input resistor 58 by the signal generator. This output voltage may be of the order of 0.1 microvolt to 0.1 volt and is measured by the attenuator scale 57 of the signal generator. The converter may be checked periodically by measuring the voltage across the output resistor 79 with a vacuum tube voltmeter, and the gain control resistor 77 may be adjusted if the measured output voltage is found to differ from the voltage indicated by scale 57.

It is frequently desirable to have available a modulated voltage of greater magnitude than may be conveniently developed across the cathode resistor 76. This higher voltage, for example of the order of one volt, may be derived from the output tube 71 across its plate load impedance at the output jack 80.

The frequency of the modulated signal output from the converter is controlled by the tuning adjustment of the oscillator 1 of the signal generator. Input signals in the range of from 70 to 95 megacycles beat with the 70 megacycle oscillator of the converter to develop output signal voltages of the same amplitude but of a lower frequency than that developed by the signal generator. The modulation characteristics of the input signal are unaffected by this heterodyning process.

The unity gain converter is preferably housed in a separate casing but, if desired, it may be housed within the casing of the signal generator illustrated in Fig. 1.

Claims to the unity gain converter have been presented in our copending divisional application, Serial No. 134,824, filed December 23, 1949.

It is to be understood that the invention is not limited to any particular frequency range or ranges of operation and that various changes may be made in the several circuit elements without departure from the scope and spirit of the invention as set forth in the following claims.

We claim:

1. A high frequency signal generator comprising an oscillator tube and associated circuit network tunable over a radio frequency range, means including a constant deviation reactance tube coupled to said circuit network for imposing a frequency modulation upon the radio frequency signal developed by said oscillator tube, an amplifier stage following said oscillator tube, means for imposing an alternating voltage upon said amplifier stage to effect an amplitude modulation of the radio frequency output of said amplifier stage, and means interposed between said amplifier stage and said oscillator tube to prevent reaction of said imposed alternating voltage upon the oscillation frequency of the oscillator tube.

2. A high frequency signal generator as recited in claim 1, wherein said last-mentioned means comprises a frequency-doubler stage between said oscillator tube and said amplifier stage.

3. A high frequency signal generator as recited in claim 1, wherein said amplifier stage includes a tube having a plurality of grid elements, means for impressing the radio frequency signal upon one of said grid elements, and means for impressing an audio voltage of adjustable magnitude upon another of said grid elements, thereby to impose an amplitude modulation of desired percentage upon the signal voltage output of said stage.

4. A high frequency signal generator comprising an oscillator tube and associated network tunable over a frequency range, a constant-deviation reactance tube coupled to said network, means for impressing a modulating voltage of adjustable magnitude upon said reactance tube, thereby to impose a frequency modulation upon the radio frequency signal developed by said oscillator tube, a frequency multiplier stage having an input circuit coupled to said oscillator tube network, an amplifier stage following said frequency multiplier stage, said amplifier stage having a tuned output circuit, range-change switch means adjustable to control the tuned output circuit to pass the fundamental or alternatively a multiple of the fundamental frequency of the radio frequency input to said amplifier stage, thereby to condition said amplifier stage for operation as an amplifier or as a further frequency multiplier, and means operable simultaneously with said switch means to reduce the modulating voltage applied to said reactance tube by the reciprocal of the multiplying factor of said amplifier stage on adjustment of said switch means to condition the amplifier stage for operation as a frequency multiplier, thereby to maintain the deviation of the output frequency constant and independent of the adjustment of said range-change switch means.

5. A high frequency signal generator comprising an oscillator tube and associated network tunable over a frequency range, a constant-deviation reactance tube coupled to said network, means for impressing a modulating voltage of adjustable magnitude upon said reactance tube, thereby to impose a frequency modulation upon the radio frequency signal developed by said oscillator tube, a frequency doubler stage having an input circuit coupled to said oscillator tube network, an amplifier stage following said frequency doubler stage, said amplifier stage having a tuned circuit including a tapped inductance and a variable condenser, a range-change switch adjustable to connect said variable condenser across all of or a part of said tapped inductance, thereby to condition said amplifier stage for operation as an amplifier or as a frequency doubler, and means operable simultaneously with said switch to reduce the modulating voltage applied to the reactance tube by one-half on adjustment of said switch to condition the amplifier stage for operation as a frequency doubler thereby to maintain the deviation of the output frequency constant and independent of the position of the range change switch.

6. A high frequency signal generator as recited in claim 5, wherein one side of said variable condenser is grounded, and said range change switch grounds one end or alternatively a tap of said tapped inductance.

7. A high frequency signal generator as recited in claim 4 in combination with a source of modulating voltage, a potentiometer connected across said source and having an adjustable contact arm, a tapped resistor connected between said contact arm and ground, circuit elements including a tap switch for impressing upon said reactance tube the voltage or a fraction of the voltage developed across said tapped resistor by said source, and a modulation meter connected between said potentiometer contact arm and ground, said meter having a scale graduated in values of the two ranges of deviation obtained by adjustment of said tap switch.

8. A high frequency signal generator comprising an oscillator tube and associated tunable circuit network, a constant-deviation reactance tube coupled to said network, a cascaded amplifier working out of said oscillator tube and including an output stage, a source of modulating voltage, a pair of circuits for connecting said source to said reactance tube and to said output stage, switch means for completing one or alternatively the other of said circuits, each of said circuits including a potentiometer for adjusting the amplitude of the modulating voltage applied to the reactance tube or the output stage, a modulation meter, a switch for connecting said meter into the circuit which is completed by said switch means, and means comprising a frequency doubler stage in said amplifier to prevent reaction upon the oscillation frequency of said oscillator tube by a modulating voltage impressed upon said output stage.

9. A frequency modulated signal generator comprising a vacuum tube oscillator having a capacitively-tuned tank circuit, a variable reactance tube effectively connected across said tank circuit, said reactance tube including a plate and grid cooperating with a cathode, means determining the frequency deviation sensitivity of said reactance tube in response to modulation voltages impressed between said grid and cathode; said means comprising an adjustable cathode resistor for said reactance tube, and capacitive means bypassing said resistor for the oscillator frequency, whereby said resistor has a degenerative effect at modulation frequencies; and biasing means adjustable to control the linearity of the developed frequency deviation; said biasing means comprising a circuit including a direct current source and an adjustable resistance for passing a current through said cathode resistor to develop a voltage drop across the same which may be adjusted independently of adjustments of said cathode resistor.

WILLIAM D. LOUGHLIN.
DONALD M. HILL.

REFERENCES CITED

The following references are of record in the file of this patent:

UNITED STATES PATENTS

| Number | Name | Date |
|---|---|---|
| Re. 22,834 | Alvira | Jan. 28, 1947 |
| 1,813,469 | Taylor | July 7, 1931 |
| 1,925,520 | Buschbeck | Sept. 5, 1933 |
| 1,933,299 | Vierling | Oct. 31, 1933 |
| 2,037,160 | Ferris | Apr. 14, 1936 |
| 2,204,179 | George | June 11, 1940 |
| 2,265,016 | White | Dec. 2, 1941 |
| 2,337,533 | Barber | Dec. 28, 1943 |
| 2,355,338 | Stewart | Aug. 8, 1944 |
| 2,361,731 | Bach | Oct. 31, 1944 |
| 2,382,436 | Marble | Aug. 14, 1945 |
| 2,423,461 | Meahl | July 8, 1947 |
| 2,441,504 | O'Brien | May 11, 1948 |
| 2,455,472 | Curl et al. | Dec. 7, 1948 |
| 2,459,846 | Smyth et al. | Jan. 25, 1949 |